US012633237B2

(12) United States Patent
Hochman et al.

(10) Patent No.: US 12,633,237 B2
(45) Date of Patent: May 19, 2026

(54) VIDEO DISPLAY PANEL MOUNTING AND ALIGNING SYSTEM AND METHOD

(71) Applicant: H2VR HoldCo, Inc., Covina, CA (US)

(72) Inventors: Jeremy Hochman, Walnut, CA (US);
Steven De Keukeleire, Dongguan City (CN)

(73) Assignee: H2VR HoldCo, Inc., Valencia, CA (US)

( * ) Notice: Subject to any disclaimer, the term of this patent is extended or adjusted under 35 U.S.C. 154(b) by 0 days.

(21) Appl. No.: 18/682,773

(22) PCT Filed: Jul. 1, 2022

(86) PCT No.: PCT/US2022/035916
§ 371 (c)(1),
(2) Date: Feb. 9, 2024

(87) PCT Pub. No.: WO2023/018495
PCT Pub. Date: Feb. 16, 2023

(65) Prior Publication Data
US 2024/0346960 A1 Oct. 17, 2024

Related U.S. Application Data

(60) Provisional application No. 63/231,347, filed on Aug. 10, 2021.

(51) Int. Cl.
*G09F 9/302* (2006.01)
*G09F 9/33* (2006.01)
*H05K 1/181* (2026.01)

(52) U.S. Cl.
CPC .............. *G09F 9/3026* (2013.01); *G09F 9/33* (2013.01); *H05K 1/181* (2013.01)

(58) Field of Classification Search
None
See application file for complete search history.

(56) References Cited

U.S. PATENT DOCUMENTS

| | | | |
|---|---|---|---|
| 805,968 | A | 11/1905 | Greenfield |
| 4,229,064 | A | 10/1980 | Vetter et al. |
| 4,611,873 | A | 9/1986 | Punako et al. |

(Continued)

FOREIGN PATENT DOCUMENTS

| | | |
|---|---|---|
| CA | 2847571 C | 3/2013 |
| CN | 202905058 U | 4/2013 |

(Continued)

OTHER PUBLICATIONS

International Search Report and Written Opinion dated Oct. 10, 2022 in connection with PCT/US2022/035916 filed Jul. 1, 2022.

(Continued)

*Primary Examiner* — Nicholas J Lee
(74) *Attorney, Agent, or Firm* — Downs Rachlin Martin PLLC

(57) ABSTRACT

Systems, devices and methods for mounting and aligning video display panels in a video display wall formed of an array of video display panels are disclosed. Disclosed embodiments provide a simplified mounting arrangement with reduced tolerances and tolerance stack up, while also permitting simple removal of individual video display panels for repair or replacement without necessitating removal or movement of video display panels adjacent the panel to be removed.

23 Claims, 16 Drawing Sheets

(56)                    References Cited

U.S. PATENT DOCUMENTS

| | | | |
|---|---|---|---|
| D506,763 | S | 6/2005 | Chu |
| D571,192 | S | 6/2008 | Stomp et al. |
| D585,837 | S | 2/2009 | Kuehne et al. |
| D687,384 | S | 8/2013 | Kazakia et al. |
| D694,273 | S | 11/2013 | Chen |
| D701,840 | S | 4/2014 | Kazakia |
| D705,167 | S | 5/2014 | Ilkhanov et al. |
| D711,835 | S | 8/2014 | Karlsson |
| D749,522 | S | 2/2016 | Evans |
| 9,260,872 | B2 | 2/2016 | Bunch et al. |
| 9,322,185 | B1 | 4/2016 | Russo |
| 9,416,912 | B2 | 8/2016 | Grziwok |
| 9,477,438 | B1 | 10/2016 | Hochman et al. |
| 9,660,403 | B2 | 5/2017 | Hochman et al. |
| 9,864,561 | B2 | 1/2018 | Hochman |
| 9,877,406 | B2 | 1/2018 | Hochman |
| 10,151,118 | B2 | 12/2018 | Irvine et al. |
| D840,934 | S | 2/2019 | Marchesi et al. |
| 10,342,150 | B1 | 7/2019 | Davis |
| 10,635,381 | B2 | 4/2020 | Nakano |
| 10,667,411 | B2 | 5/2020 | Shin |
| 10,672,306 | B1 | 6/2020 | Whidden |
| D915,292 | S | 4/2021 | Corona |
| 11,288,028 | B2 | 3/2022 | Miles |
| 11,353,732 | B2 | 6/2022 | Yoon |
| 2002/0029898 | A1 | 3/2002 | Zink et al. |
| 2005/0221637 | A1 | 10/2005 | Ice et al. |
| 2006/0024005 | A1 | 2/2006 | Ice et al. |
| 2011/0151706 | A1 | 6/2011 | Miller et al. |
| 2014/0247612 | A1 | 9/2014 | Hochman |
| 2016/0210886 | A1 | 7/2016 | Brashnyk |
| 2017/0220310 | A1 | 8/2017 | Hochman |
| 2017/0257146 | A1 | 9/2017 | Szeto |
| 2019/0037712 | A1 | 1/2019 | Kim |
| 2019/0277485 | A1 | 9/2019 | Harrington |
| 2019/0350094 | A1 | 11/2019 | Miller |
| 2020/0058238 | A1 | 2/2020 | Davis |
| 2021/0054991 | A1 | 2/2021 | Stary |
| 2023/0384536 | A1 | 11/2023 | Russert et al. |

FOREIGN PATENT DOCUMENTS

| | | |
|---|---|---|
| JP | 2013029773 A | 2/2013 |
| WO | 2020074064 A1 | 4/2020 |

OTHER PUBLICATIONS https://www.amazon.com/dp/B01LCV97Ay?th=1; BTF-Lighting 2 Pin Electrical Connector; accessed from website on Aug. 2, 2024; pp. 1-7.

https://www.amazon.com/SZJELEN-2Pin-12Pin-Waterproof-Electrical-Connectors/dp/B07YWLM511?th=1; accessed from website on Aug. 2, 2024.

SP21 9Pin Waterproof Heavy Connector, dated Mar. 18, 2018, [online], [site visited Apr. 30, 2025]. Available from Internet, URL: https://www.amazon.com/Waterproof-Connector-2Screw-Voltage-Bulkhead/dp/B07BJXGNS3?th=1 (Year 2018).

HT HE21 9 Pin Waterproof Aviation Connector, dated May 31, 2018, [online], [site visited Apr. 30, 2025]. Available from Internet, URL: https//www.amazon.com/dp/B07DL49FG5 (Year 2018).

7 Pin Round Female Plug Male Socket Straight Aviation Connector GX20, dated Nov. 13, 2018, [online], [site visited Apr. 30, 2025]. Available from Internet, URL: https//www.amazon.com/dp/B07KG6WQ1C (Year 2018).

SD13 4 Pin Waterproof Connector, dated Mar. 11, 2018, [online], [site visited Apr. 30, 2025]. Available from Internet, URL: https//www.amazon.com/Waterproof-Connector-Voltage-Electronic-Circular/dp/B07BDCYXWQ?th=1 (Year 2018).

VIDEO DISPLAY PANEL MOUNTING AND ALIGNING SYSTEM AND METHOD

RELATED APPLICATION DATA

This application claims the benefit of priority of U.S. Provisional Patent Application Ser. No. 63/231,347, filed Aug. 10, 2021, and titled "LED Panel Mounting and Leveling System and Method", and U.S. Nonprovisional patent application Ser. No. 17/743,994, filed on May 13, 2022, and titled "Video Display Panel Mounting and Aligning System and Method". Each of these applications is incorporated by reference herein in its entirety.

FIELD

The present disclosure relates to systems and methods for mounting video display panels in mosaicked video walls, and, more particularly, to video display panel mounting and aligning systems and methods.

BACKGROUND

Modular electronics, i.e., electronic systems composed of discrete components that are electrically connected together to form an overall system, are used in a variety of applications. For example, large electronics graphical displays, such as video screens for stadiums and other large performance venues, electronic advertising billboards, and other electronic displays are often composed of modular display panels (also sometimes called "tiles", "display tiles" or "LED tiles" that are assembled into large arrays or mosaics that form an overall composite electronic display. Present means for securing discrete display panels to support structures typically involve mechanical fastening of one sort or another, and present means for electrically connecting the discrete panels to display controllers often involve separate wiring harnesses and/or electrical connectors that require the panels to be in a specific rotational orientation.

Advances in creating such modular display arrays are described, for example, in U.S. Pat. No. 9,477,438, entitled "Devices for Creating Mosaicked Display Systems, and Display Mosaic Systems Comprising Same." In spite of advances in the art, current systems still may suffer from disadvantages related to complexity in assembling display panel arrays including challenges in presenting a uniform and accurate continuous display surface due to the tolerances on a number of components that must be connected to create a display panel array with current technology.

FIG. 23 illustrates one problem with tolerance stack-up in a prior art display panel display system using LED panels. As shown therein, a conventional system includes a display array chassis 2 providing structural support onto which an LED module housing/heatsink 4 is mounted. The LED printed circuit board (PCB) 6, i.e. comprising the display surface, is then attached to the LED module housing 4. All of these components are mounted on a wall (W) or other mounting substrate. This arrangement presents at least three connecting surfaces A, B and C, and numerous tolerances based on dimensional thickness of the components and the design of the connection interface at each connecting surface A, B, and C. Because of the numerous parts making up the system, there are many instances of tolerance stack-up. Even with extremely tightly controlled tolerances (for example in the thousandths of an inch range), it can be difficult to achieve a uniform display surface as resolutions go below 1 mm pixel pitch for new display systems.

There thus continues to be a need in the art for improved systems for connecting and aligning display panels in modular array displays systems.

SUMMARY

In one implementation, a video display wall according to the present disclosure comprises a plurality of video display panels arranged in an array on a support structure, wherein adjoining display panels in the array are aligned edge-to-edge, corners of display panels interior to the array adjoin more than one other display panel interior corner and corners of display panels along an outer edge of the array adjoin at least one other display panel edge corner, and also comprises a first type alignment mount disposed between the video display panels and the support structure at each meeting of interior display panel corners, wherein the first type alignment mounts each comprise a body member with a support contact surface engaging the support structure and a display contact surface engaging the adjoining display panel interior corners, and the support contact surface and the display contact surface are separated by a fixed depth dimension.

In a further implementation, a video display wall according to the present disclosure may also comprise a second type alignment mount disposed between the video display panels and the support structure at each meeting of two display panel corners along the outer edge of the array of display panels. The second type alignment mounts each comprise a body member with a support contact surface engaging the support structure and a display contact surface engaging the adjoining display panel outer edge corners. The support contact surface and the display contact surface of the second type alignment mount are separated by the fixed depth dimension. One edge of the second type alignment mount body member substantially aligns with or falls inside an outer periphery of the video display wall.

In an another implementation, a video display wall according to the present disclosure may also comprise a third type alignment mount disposed between the video display panels and the support structure at each corner of the display wall. The third type alignment mounts each comprise a body member with a support contact surface engaging the support structure and a display contact surface engaging the corner of display panels at corners of the display wall. The support contact surface and the display contact surface of the third type alignment are separated by the fixed depth dimension. Two edges of the third type alignment mount body member substantially align with or fall inside the video display wall outer periphery.

In an another implementation, each type of alignment mount may comprise at least one support connector that attaches the body member to the support structure with the support contact surface against the support structure, and at least one display connector that attaches the body member to each of the video display panel corners with the alignment mount display contact surface against each video display panel.

In an another implementation, each type of alignment mount in a video display wall according to the present disclosure may also comprise the support contact surface and surface display contact surface lying in at least substantially parallel X-Y planes separated by the fixed depth dimension along an at least substantially perpendicular Z direction. Also, the support connector and the display connectors may comprise connectors configured to fix the video display panel and support structure against the respective contact surfaces in the Z direction while allowing variations of position in their respective X-Y planes.

In an another implementation, the fixed depth dimension has a single predetermined tolerance range.

In another implantation, for each type alignment mount in a video display wall according to the present disclosure, the body member comprises a front wall on the display side and a rear wall on the support side, the display contact surface is disposed at least in part on a surface of the front wall, the support contact surface is disposed at least in part on a surface of the rear wall, the display connectors are disposed on the body member within the front wall, and the support connectors are disposed on the body member within the rear wall.

In another implementation, in a video display wall according to the present disclosure, the front wall is formed as a series of raised shapes with open centers, the display contact surface surrounds the open centers, and display connectors are disposed in the open centers.

In another implementation, in a video display wall according to the present disclosure, the front wall is formed as a series of annular walls joined by connecting walls arranged around a periphery of the body member on the body member display side, and the display connectors comprise magnets disposed within at least one annular wall in each quadrant.

In another implementation, in a video display wall according to the present disclosure, the display connectors further comprise open annular walls configured to receive an alignment pin mounted on back corners of the video display panels, wherein each quadrant contains one open annular wall and one annular wall with the magnet.

In another implementation, in a video display wall according to the present disclosure, the display contact surface of the first type alignment mount comprises four quadrants with each quadrant configured to receive a corner of a video display panel, each quadrant including at least one said display connector.

In another implementation, in a video display wall according to the present disclosure, each first type alignment mount further comprises a plurality of electrical contacts disposed in each quadrant configured to mate with display panel electrical contacts to provide at least one of data and power connections between adjacent display panels.

In another implementation, in a video display wall according to the present disclosure, the display contact surface of the second type alignment mount comprises two halves each configured to receive a corner of a video display panel, and each display contact surface half includes at least one display connector.

In another implementation, in a video display wall according to the present disclosure, each second type alignment mount further comprises a plurality of electrical contacts disposed in each half configured to mate with display panel electrical contacts to provide at least one of data or power connections between adjacent display panels.

In another implementation, in a video display wall according to the present disclosure, the second type alignment mount body member has a straight outer edge extending across both halves of the display contact surface, and the straight outer edge is configured to align with outer edges of two adjacent video display panels when attached together to the display contact surface.

In another implementation, in a video display wall according to the present disclosure, the support connectors and the display connectors are configured to engage mating connector parts disposed respectively on the support structure and the video display panel, and the support and display connectors comprise one or more of magnets, threaded connectors, pins, clips, sockets, bayonet mounts, or roller bearing sleeves.

In another implementation, in a video display wall according to the present disclosure, the video display panels are rectangular in shape and arranged in a herringbone pattern.

In another implementation, in a video display wall according to the present disclosure, the display panels are trapezoidal in shape and arranged in a chevron pattern.

In a different alternative implementation, a video display panel alignment mount according to the present disclosure comprises a body member having opposed support and display sides, a support contact surface on the support side, a display contact surface on the display side, at least one support connector on the support side configured to attach the body member to a support structure with the support contact surface against the support structure, and at least two display connectors on the display side configured to attach a video display panel to the display contact surface. The support contact surface and the display contact surface are separated by a fixed depth dimension In another implementation, in a video display panel alignment mount according to the present disclosure, the support connector and the display connectors are configured to engage mating connector parts disposed respectively on the support structure and the video display panel.

In another implementation, in a video display panel alignment mount according to the present disclosure, the support contact surface and surface display contact surface lie in parallel X-Y planes separated by the fixed depth dimension along an at least substantially perpendicular Z direction, and the support connector and the display connectors comprise connectors configured to fix the video display panel and support structure against the respective contact surfaces in the Z direction while allowing variations of position in their respective X-Y planes.

In another implementation, in a video display panel alignment mount according to the present disclosure, the support and display connectors comprise one or more of threaded connectors, pins, clips, sockets, bayonet mounts, or roller bearing sleeves.

In another implementation, in a video display panel alignment mount according to the present disclosure, the body member comprises a front wall on the display side and a rear wall on the support side, the display contact surface is disposed at least in part on a surface of the front wall, the support contact surface is disposed at least in part on a surface of the rear wall, the display connectors are disposed on the body member within the front wall, and the support connectors are disposed on the body member within the rear wall.

In another implementation, in a video display panel alignment mount according to the present disclosure, the front wall is formed as a series of raised shapes with open centers, the display contact surface surrounds the open centers, and display connectors are disposed in said open centers.

In another implementation, in a video display panel alignment mount according to the present disclosure, the front wall is formed as a series of annular walls joined by connecting walls arranged around a periphery of the body member on the body member display side, and the display connectors comprise magnets disposed within at least one annular wall in each quadrant.

In another implementation, in a video display panel alignment mount according to the present disclosure, the display connectors further comprise open annular walls configured to receive an alignment pin mounted on back corners of the video display panels, and each quadrant contains one open annular wall and one annular wall with the magnet.

In another implementation, in a video display panel alignment mount according to the present disclosure, the display contact surface comprises four quadrants each configured to receive a corner of a video display panel, each quadrant including at least one said display connector.

In another implementation, a video display panel alignment mount according to the present disclosure also comprises at least two display connectors in each quadrant of the display contact surface.

In another implementation, a video display panel alignment mount according to the present disclosure also comprises a plurality of electrical contacts disposed in each quadrant configured to mate with display panel electrical contacts to provide at least one of data or power connections between adjacent display panels.

In another implementation, in a video display panel alignment mount according to the present disclosure, the display contact surface comprises two halves each configured to receive a corner of a video display panel, and each display contact surface half includes at least one display connector.

In another implementation, a video display panel alignment mount according to the present disclosure also comprises a plurality of electrical contacts disposed in each half configured to mate with display panel electrical contacts to provide at least one of data or power connections between adjacent display panels.

In another implementation, in a video display panel alignment mount according to the present disclosure, the body member has a straight outer edge extending across both halves of the display contact surface, and said straight outer edge is configured to align with outer edges of two adjacent video display panels when attached together to the display contact surface.

In another implementation, in a video display panel alignment mount according to the present disclosure, the display contact surface comprises two halves each configured to receive a side portion of a video display panel, and each display contact surface half includes at least one display connector.

In another implementation, a video display panel alignment mount according to the present disclosure also comprises a plurality of electrical contacts disposed in each half configured to mate with display panel electrical contacts to provide at least one of data or power connections between adjacent display panels.

In another implementation, a video display panel alignment mount according to the present disclosure also comprises a power supply connector in electrical communication with selected electrical contacts of said plurality of electrical contacts.

In another implementation, in a video display panel alignment mount according to the present disclosure, the body member has a rectangular shape with opposed short sides and opposed longer sides, the display contact surface in each half comprises two annular walls spaced apart along each longer side, and the display connectors are disposed within the annular walls.

In another implementation, in a video display panel alignment mount according to the present disclosure, plural alignment mounts are integrated with a support frame on the support side.

In a further implantation of the present disclosure a video display panel alignment emitting mount as described herein is incorporated into a video display wall comprising a plurality of video display panels, a plurality of panel alignment mounts, and a support structure.

In still a further implementation of the present disclosure, a method of mounting and aligning video display panels in a video display wall comprises directly attaching an array of alignment mounts to a support structure, each alignment mount having the same thickness dimension with uniform tolerance on the thickness dimension, and directly attaching the video display panels at each corner to the alignment mounts, wherein the alignment mounts form a single layer with the thickness dimension between the video display panels and support structure.

In another implementation of methods according to the present disclosure, the video display panels each comprise an array of light-emitting elements supported on a printed circuit board (PCB) and said alignment mounts attach directly to said PCBs.

In another implementation of methods according to the present disclosure, the PCBs are magnetically connected to the alignment mounts.

In another implementation, methods according to the present disclosure further comprise removing one or more individual video display panels from the video wall in a direction perpendicular to the video wall display surface without moving video display panels adjacent to the removed video display panel.

In another implementation, methods according to the present disclosure further comprise controlling said uniform tolerance to be in the range of about +/−0.01 mm or less.

BRIEF DESCRIPTION OF DRAWINGS

For the purpose of illustrating the disclosure, the drawings show aspects of one or more embodiments of the disclosure. However, it should be understood that the present disclosure is not limited to the precise arrangements and instrumentalities shown in the drawings, wherein.

DETAILED DESCRIPTION

Embodiments disclosed herein solve problems in the mounting and alignment of modular display panels that can arise from the complexity of existing mounting systems and, in particular, tolerance stack-up in assembly of the panels. Disclosed embodiments also offer further advantages in allowing panels to be removed perpendicularly with respect to the face of the display without affecting the surrounding display panels. Embodiments disclosed herein, and the principles, teachings and advantages taught through the disclosed embodiments, apply generally to modular or mosaicked video displays made up of an array of display panels. Examples of such display panels suited for use in such arrays include, but are not limited to, OLED panels, LED panels, LCD panels, and bistable display panels. As such, the use of LED panels in the following descriptions of exemplary embodiments is for illustration purposes and is not intended to limit, and does not limit, the present disclosure to LED panels specifically.

In one example, as illustrated in FIGS. 1-4, display wall 100 is comprised of an array of display panels 101. The display panels may be provided in a number of different configurations. For example, as is known in the art, using conventional surface-mount technology (SMT) 3-colors-in-1 LEDs are soldered onto a printed circuit board (PCB) 102 to form the pixels of the panels. In another example, chip-on-board (COB) technology may be used, in which individual LED dies (single color, 3 dies R+G+B form one pixel) are taken directly from a silicon wafer and bonded to a PCB 102. With COB technology there is typically a further protective layer (not shown) such as epoxy layered over the bonded wafers and PCB 102 to form a multi-layer panel 101. Regardless of the display type or panel fabrication technique, light emitting elements of the individual panels are mounted directly or indirectly on a PCB 102 or other similar substrate. Thus, PCB as used herein refers to any such substrate on which the light emitting elements of the display are mounted or bonded directly or indirectly.

Figure 1:
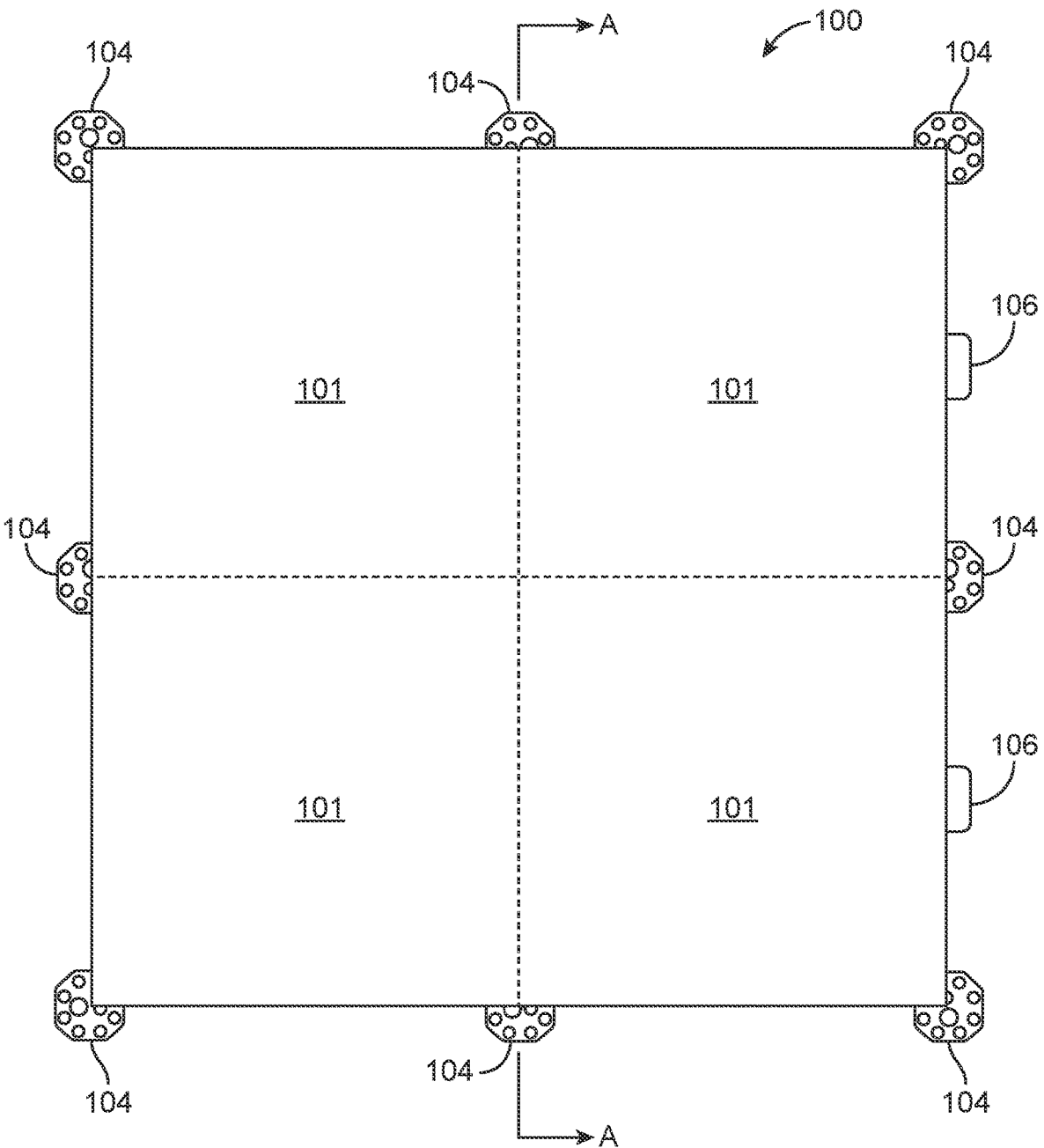
FIG. 1 is a front view of a portion of a video display wall according to the present disclosure.
Figure 2:
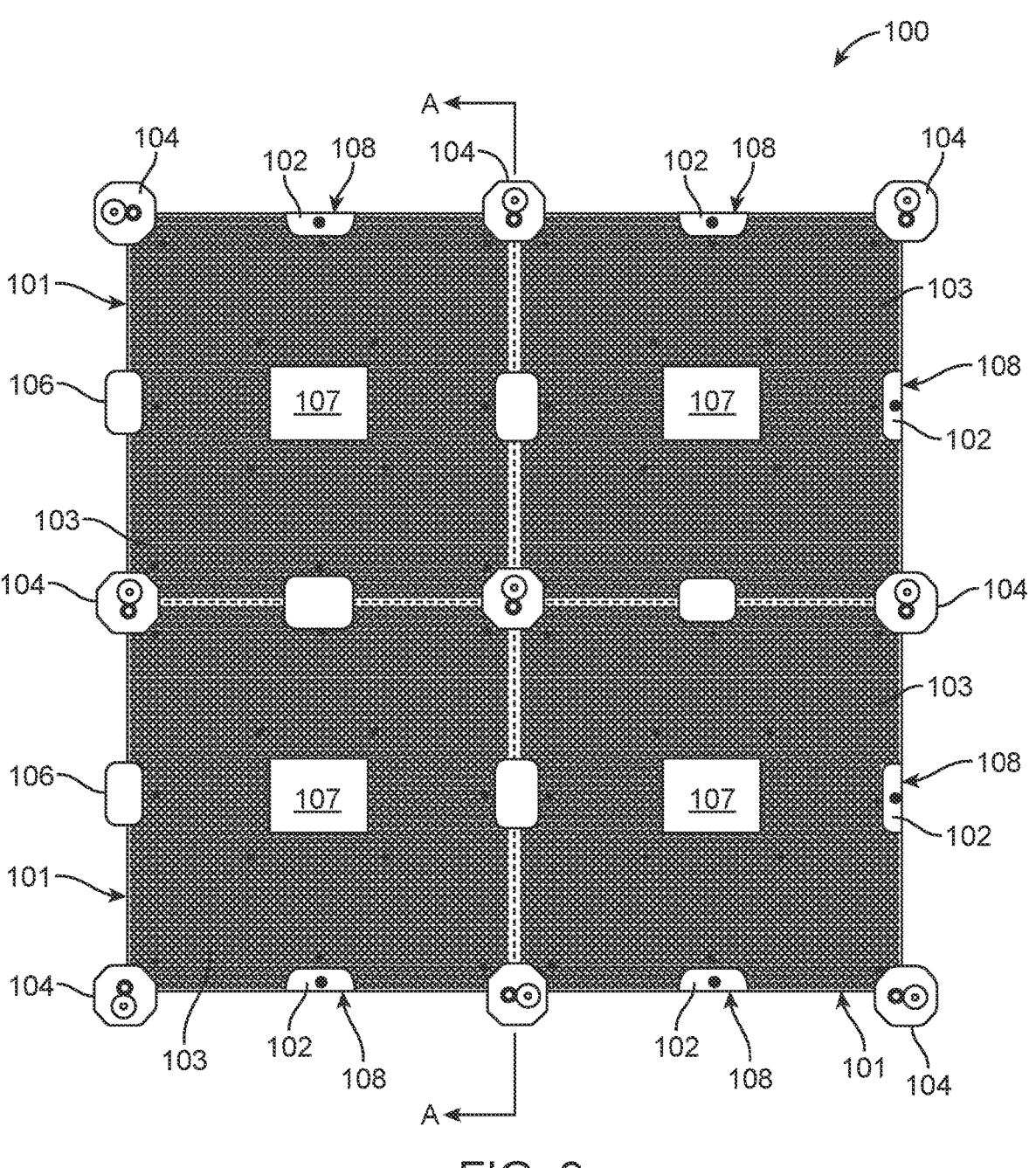
FIG. 2 is a back view of a portion of a video display wall according to the present disclosure.
Figures 3, 4:
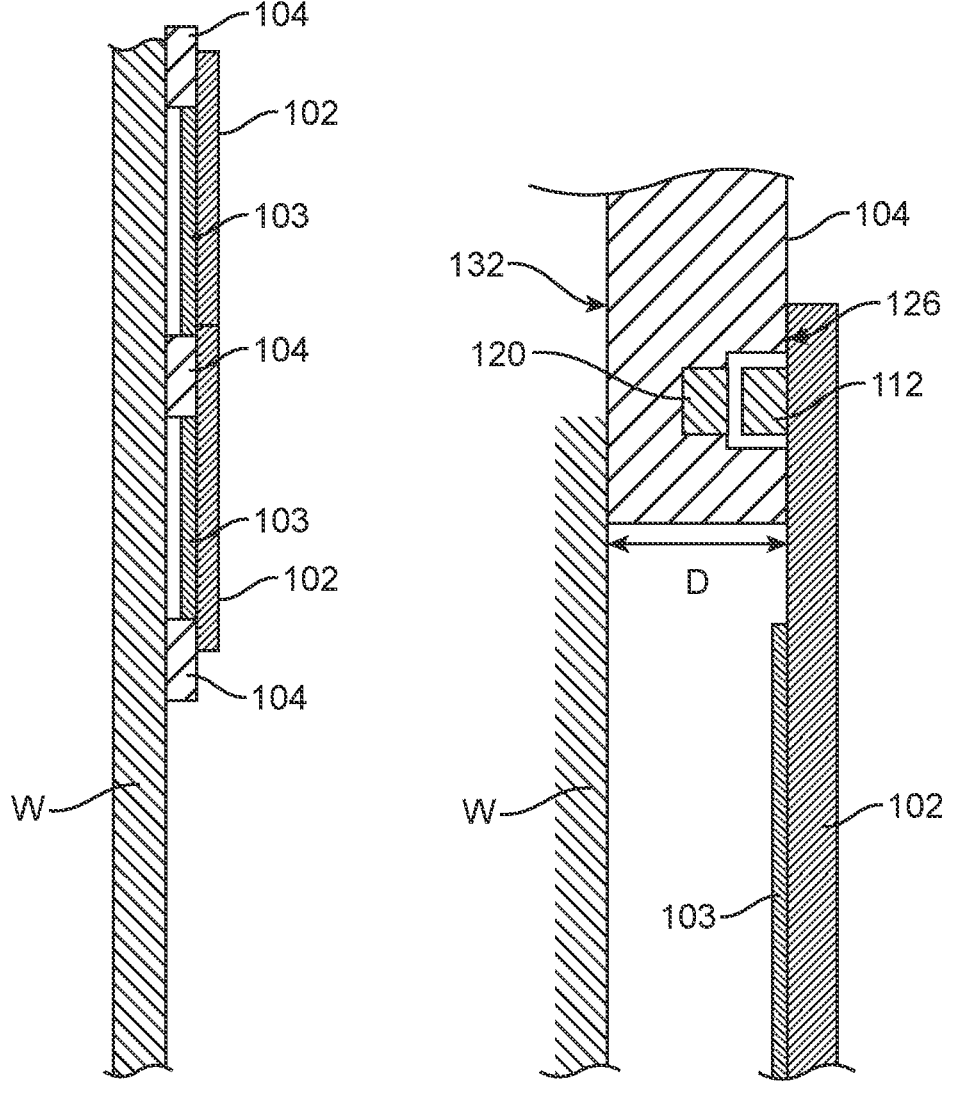
FIG. 3 is a side cross-sectional view of a video display wall mounting system through line A-A in FIGS. 1 and 2.
FIG. 4 is a detail cross-sectional view of a portion of FIG. 3.

With reference to FIGS. 2-4, in this specific example, LED panels 101 have an optional panel electronics module 103 attached to the back of PCB 102, which in this case includes a panel controller 107. In some cases, panel electronics module 103 may be omitted, with its functions incorporated directly into the PCB, in which case there may be a bare PCB back or alternatively an aesthetic cover similar in appearance to electronics module 103 may be used in its place. The presence or absence of a panel electronics module 103, or of variations thereof, does not affect the mounting and aligning of display panels in accordance with embodiments disclosed herein because, as described in more detail below, the structural connections for mounting and alignment are made directly to the back of the panel PCB 102.

Figure 6:
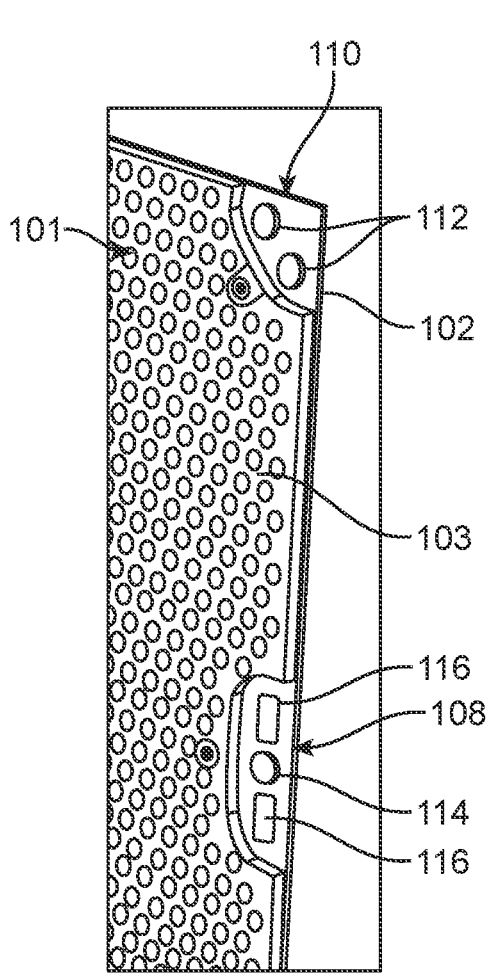
FIG. 6 is another detail back-perspective view of a portion of the video display wall in FIGS. 1 and 2.

As further illustrated in FIGS. 1-4, mounting and alignment of display panels 101 is accomplished with corner mounts 104 provided in the corners of the panels and side mounts 106 provided on the adjoining panel sides. In various embodiments one or both of corner mounts 104 and side mounts 106 may provide structural and/or electrical connections. As shown in FIG. 6, corner mounts 104 attach to the panels at structural contact zones 110 on the back of PCB 102. Side mounts 106 attach to electrical contact zones 108, also on the back of PCB 102.

As illustrated in FIGS. 3 and 4, the distance (D) is the only tolerance between the wall (W) on which the panels are mounted and the back of PCB 102. With the tolerance for distance (D) known and tightly controlled, this structure and mounting method thus removes all but a single tolerance as compared to prior art mounting systems with three or more tolerance locations, providing greater accuracy and repeatability for mounting and aligning display panels. With the single tolerance location there is no tolerance stack-up, providing easier control of accuracy, ease of assembly and concomitantly reduced cost, thus solving problems long associated with prior mounting systems.

Figure 5:
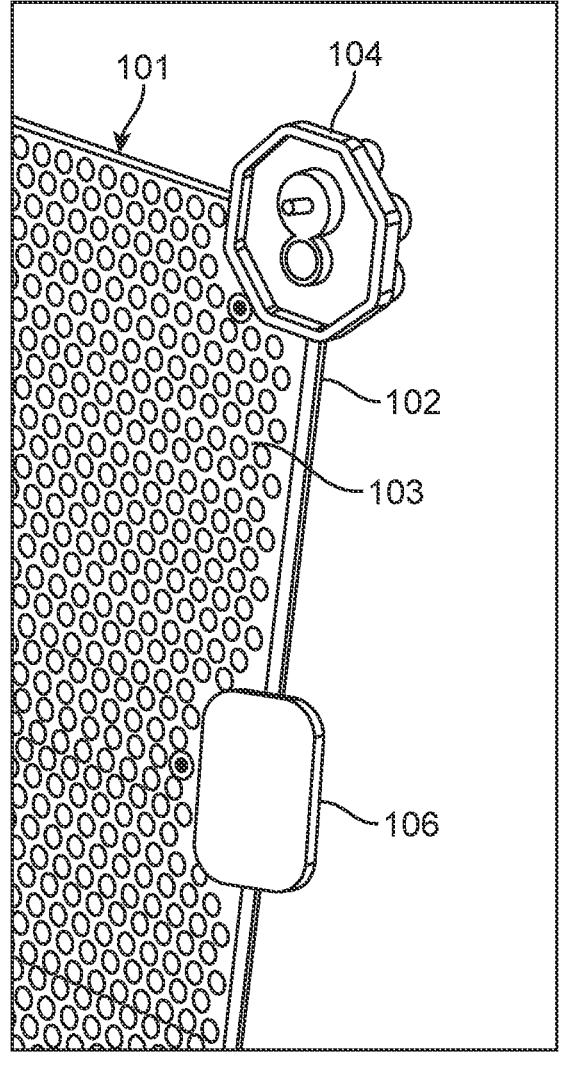
FIG. 5 is a detail back-perspective view of a portion of the video display wall in FIGS. 1 and 2.
Figure 7:
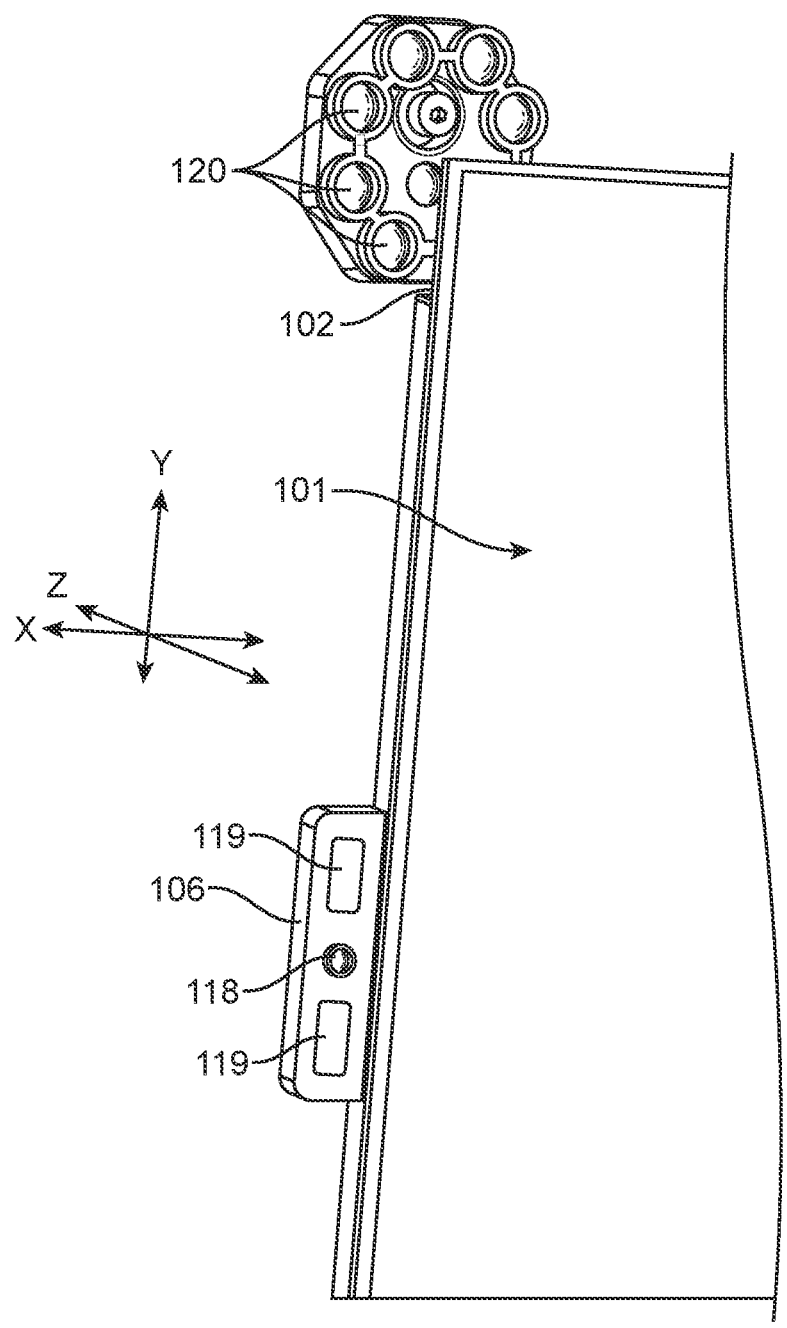
FIG. 7 is a detail front-perspective view of a portion of the video display wall in FIGS. 1 and 2.

As shown in more detail in FIGS. 5-7, each structural contact zone 110 comprises connector disks 112, which are magnets or ferrous disks attached to the back of PCB 102. Connector disks 112 are positioned to mate with connector magnets 120 on corner mounts 104 as described below. Electrical contact zones 108 also include magnets or ferrous connector disks 114 and one or more electrical contacts 116. Connector disks 114 are positioned to mate with connector magnets 118 on side mounts 106. Electrical contacts 116 are positioned to mate with electrical contacts 119 on side mounts 106.

Figure 8:
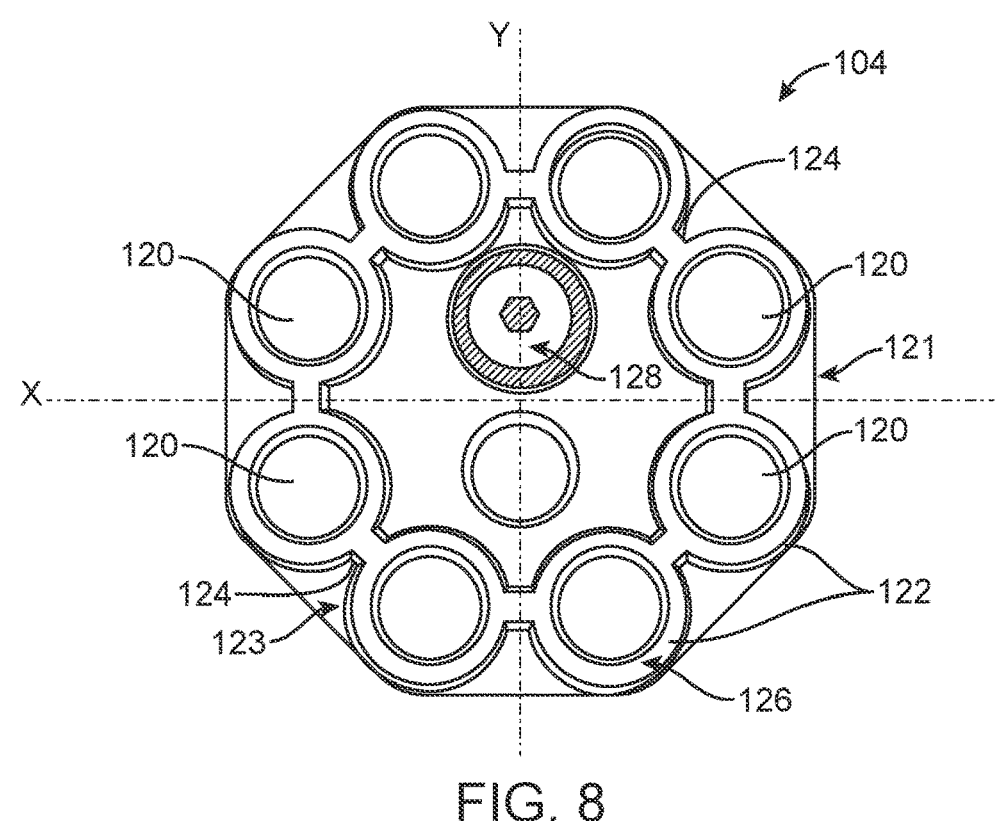
FIG. 8 is a front view of a mounting component for a video display wall according to the present disclosure.
Figure 9:
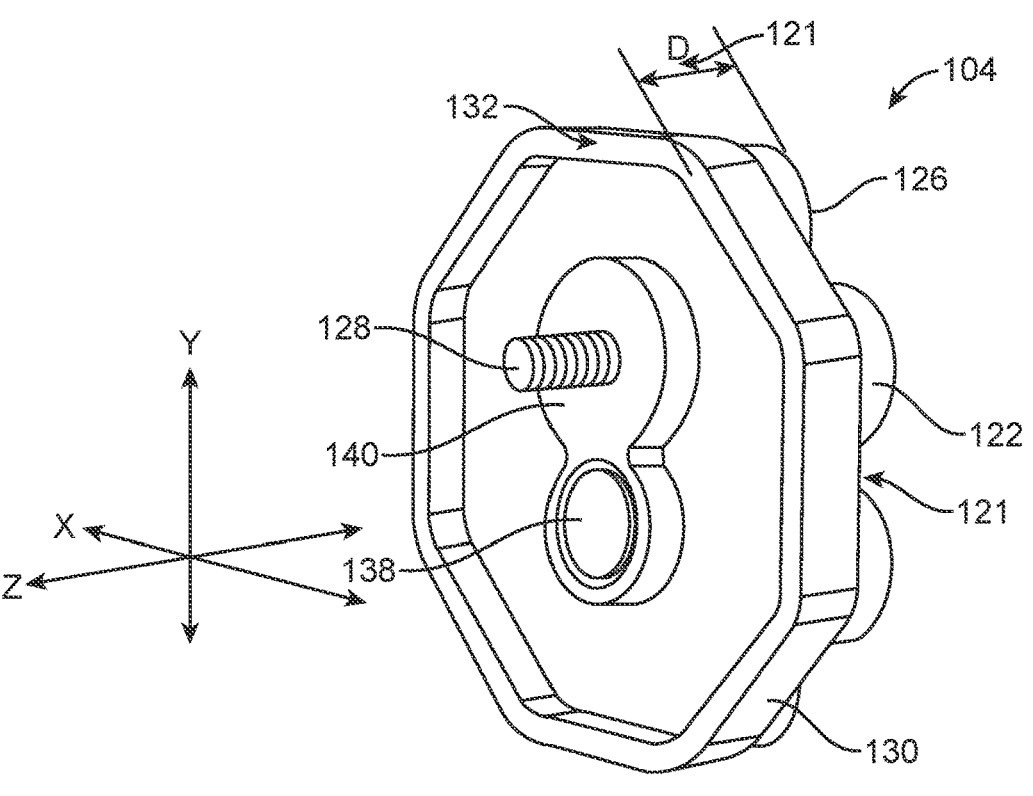
FIG. 9 is a perspective view of the mounting component in FIG. 8.

In general, as shown in FIGS. 8 and 9, corner-type mounts configured to support the adjacent corners of four display panels in a video wall array may be considered as having connectors arranged in four quadrants (Q1-Q4) in an X-Y plane, with at least one connector in each quadrant. The critical depth dimension (D) lies along the Z direction, which is at least substantially perpendicular to the X-Y plane. Corner mount 104, as illustrated in detail in FIGS. 8 and 9, is one example of an embodiment of a corner mount according to the present disclosure. In this example, corner mount 104 includes body member 121 on which connector magnets 120 are disposed within a front wall structure 123. Here, front wall structure 123 is configured as a series of annular walls 122 formed around the display side of corner mounts 104. Annular walls are a convenient wall shape that compliments round connectors such as disk magnets or screws, however the specific shape of the wall is not a critical feature with respect to the function of the mounts. Annular walls 122 may be joined by optional connecting walls 124 to provide increased rigidity. The upper surface of front wall structure, formed in this embodiment by annular and connecting walls 122/124, defines display contact surface 126. On the opposite side of body member 121, a rear wall 130 surrounds the corner mount periphery. Rear wall 130 has an outer surface that defines a rear facing support contact surface 132. Support contact surface 132 is disposed at a precisely controlled depth (D) from display contact surface 126. Ideally, tolerances on distance D are held as tightly as possible for the manufacturing technique employed. In some embodiments, the tolerance range for distance D may be about +/−0.01 mm, and in other embodiments more preferably about +/−0.005 mm.

At the center of corner mount 104, mounting screw 128 is provided around which inner rear mounting surface 140 is formed, which may be coplanar with contact surface 132. The threaded end of the mounting screw 128 extends from the back side of corner mount 104. Also on the back side of corner mount 104 another connector magnet 138 is optionally provided, which may be used in lieu of or with screw 128 to mount the corner mount on ferrous walls (W) or other suitable display support structure.

Figure 10:
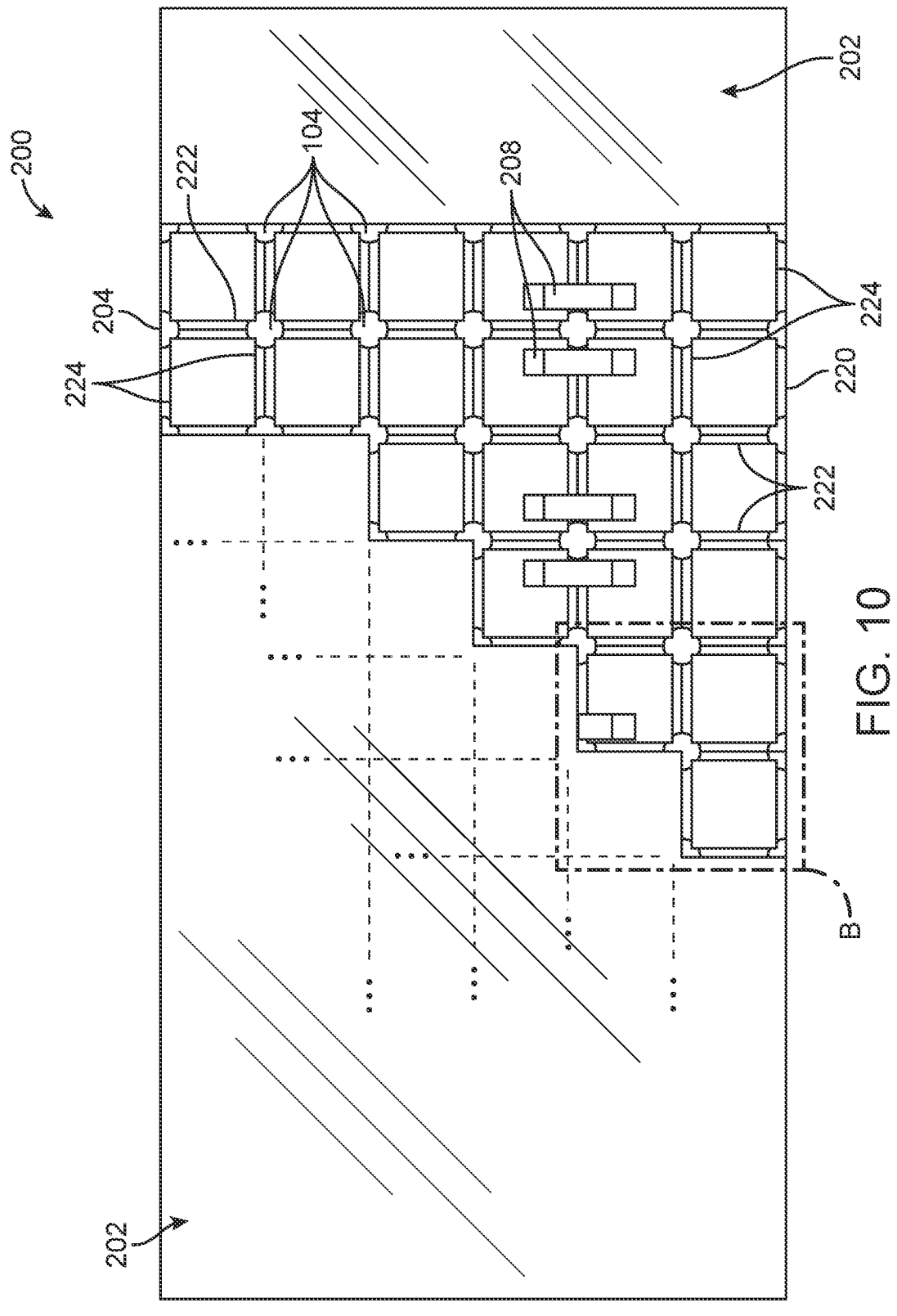
FIG. 10 is a front view of an alternative embodiment of a video display wall with a portion of the display panels removed to reveal the support structure.
Figure 11:
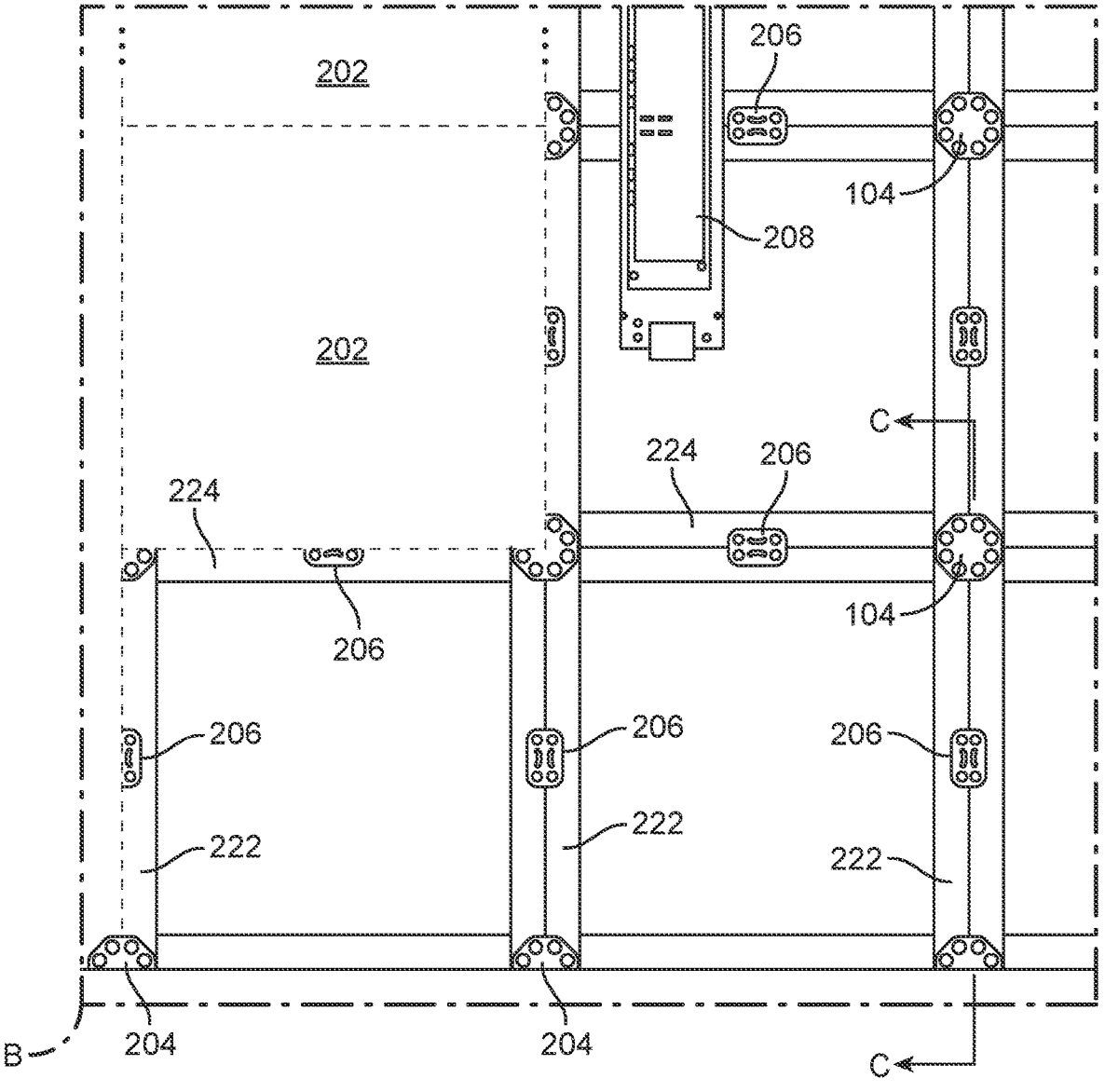
FIG. 11 is a front detail view of the display wall of FIG. 10 at box B in FIG. 11.

FIGS. 10 and 11 illustrate an alternative display wall 200 in which LED display panels 202 are mounted on a support grid 220. Display wall 200 is shown in FIG. 10 in a front view with a number of individual panels 202 removed to reveal support grid 220 behind the panels. Many types of support structures may be used to secure a video wall to an underlying structural wall or other structural support. In this example, support grid 220 comprises a plurality of vertical members 222 joined by horizontal supports 224. Support grid 220 is modularly configured to be assembled to any size structure with connections between the vertical members and horizontal supports. Vertical members 222 may be continuous or formed in sections connected together. In other embodiments, horizontal supports 224 may instead be formed as continuous members with short vertical members connected therebetween. Other support configurations may be provided by persons of ordinary skill in the art based on the teachings of the present disclosure.

Figures 12, 13:
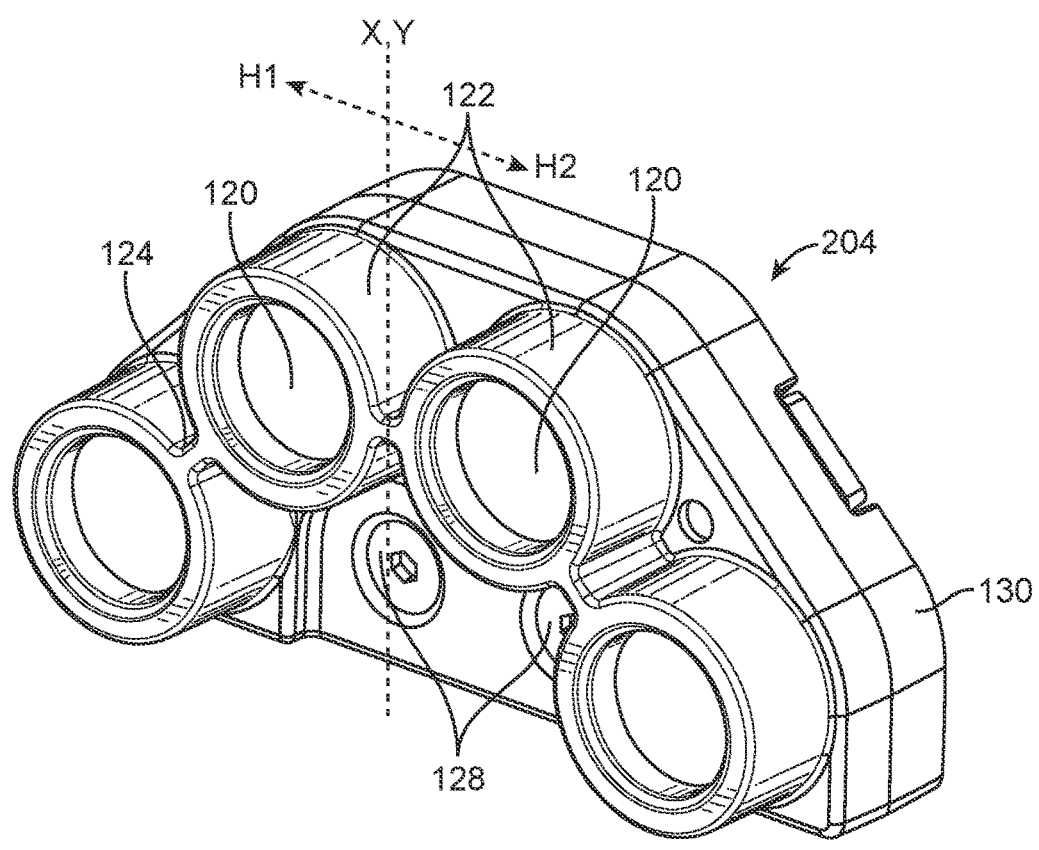
FIG. 12 is a perspective view of a half-corner mount according to an embodiment of the present disclosure.
FIG. 13 is a perspective view of a quarter-corner mount according to an embodiment of the present disclosure.

Corner mounts 104 are attached to support grid 220 at each intersection of vertical members 222 and horizontal supports 224, for example by using mounting screws 128 and/or connector magnet 138 as previously described. Corner mounts 104 (and alternatives 230, 260 and 284) are configured to support corners of the display panels interior to the array of display panels. Half corner mounts 204 (see also FIG. 12) are provided along the outer edges of display wall 200 with straight outer edges so as to not protrude beyond the outer edges of the array of display panels 202. Half corner mounts 204 have a display contact surface that is divided in two halves H1,H2 along an X/Y axis, and are thus configured to support corners of the display panels along the outer edges of the array of display panels. Quarter corner mounts 205, shown in FIG. 13 (not visible in FIGS. 10 and 11), are used in the four corners of display wall 200 for the same reason to support the display panels with exterior corners in the array of display panels. Quarter corner mounts 205 have two straight outer edges so as not to protrude beyond the outer edges of the array of display panels 202 at each corner of the array. In this embodiment, alternative side mounts 206 (see also FIG. 14) are utilized for both electrical connections and mechanical support along the panel edges. In the display wall configuration shown in FIGS. 10 and 11, power supplies 208 are provided on support grid 220 to provide power to panels 202 via side mounts 206 as described further below.

Figure 14:
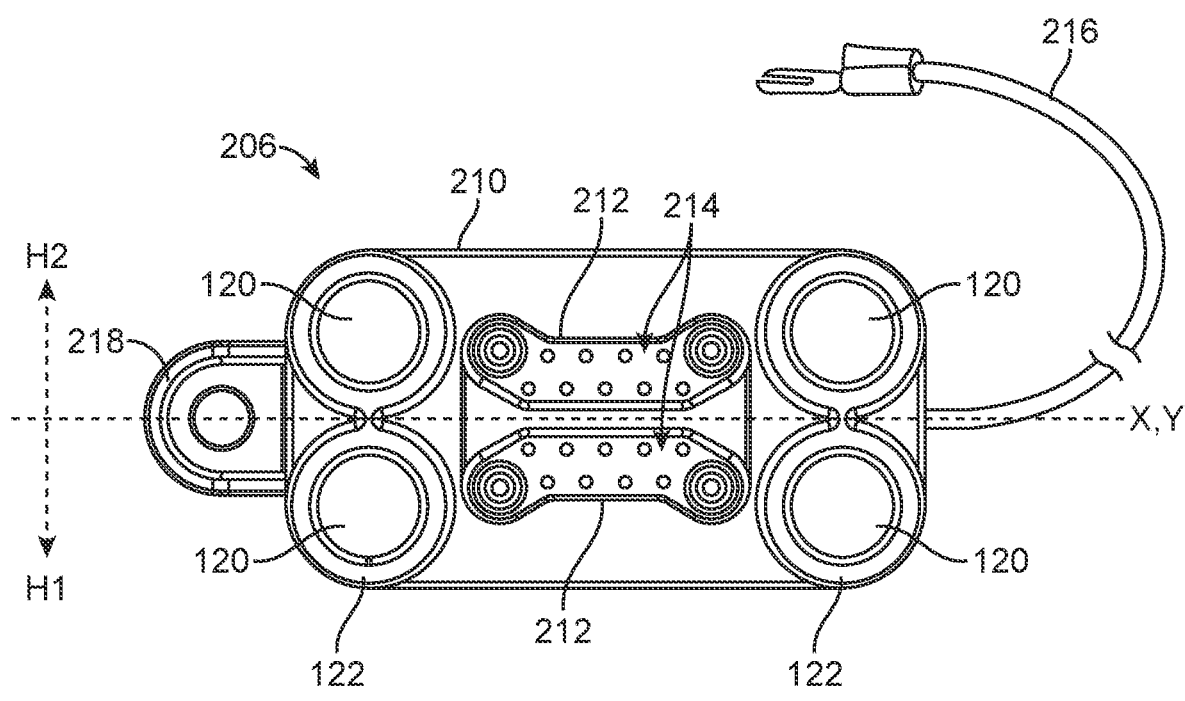
FIG. 14 is a plan view of an alternative side mount providing both electrical and structural connections.

As shown in FIG. 14, alternative side mounts 206 are configured to provide power and data connections, along with supplemental mechanical fitment via connector magnets 120 positioned within annular walls 122 as described above with respect to corner mount 104 and other disclosed embodiments. Mounts 206 comprise housing 210, which defines annular walls 122 and carries pin plates 212, which provide a plurality of electrical contacts 214. Electrical contacts 214 may provide both power and data connections. In one example, power is provided from power supplies 208 (e.g. FIG. 11) via power supply connector 216. Annular walls 122 and connector magnets 120 can help align the mount for the data pins, but also can provide alignment advantages in the Z-axis (with respect to the display surface). Alternatively, side mount 206 may include an internal PCB to facilitate data and power routing. Side mounts 206 are also divided into two halves H1,H2 along an X/Y axis. Note that while side mounts 206 are not required to be mounted to a support structure, optional mounting flange 218 may be provided to temporarily secure the side mounts in position prior to display panel installation.

Figure 15:
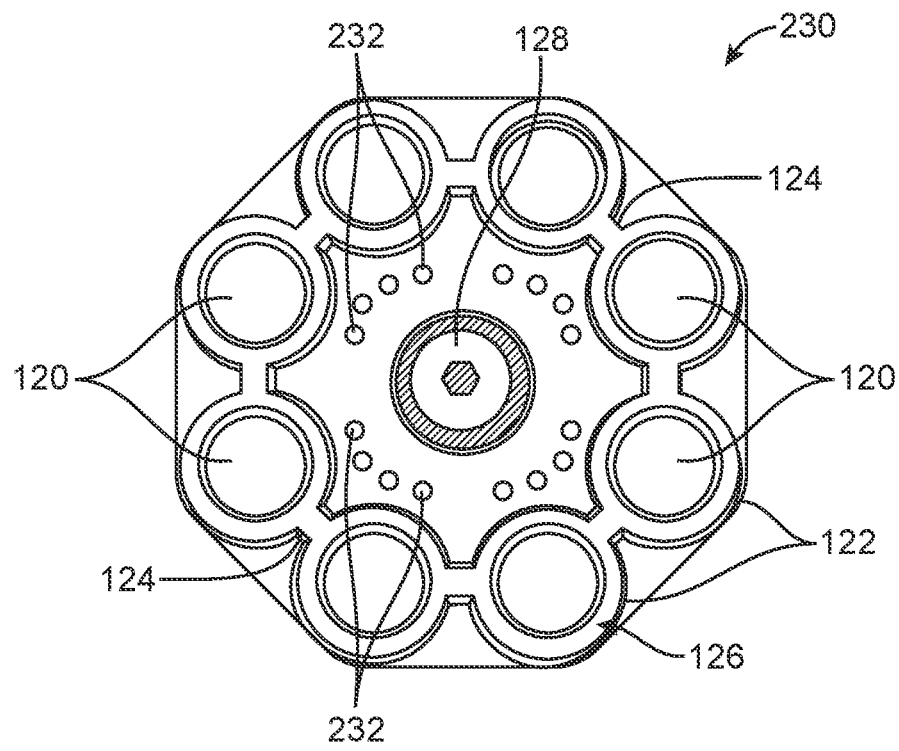
FIG. 15 is a plan view of an alternative corner mount providing both electrical and structural connections.

FIG. 15 illustrates a further alternative corner mount 230 with electrical contact pins 232. The structure of corner mount 230 may otherwise be substantially similar to corner mount 104 as described above. Electrical contact pins 232 may provide power and/or data connections in the same manner as the contact pins for side mounts 106 and 206 to supplement or replace those connectors. For example, in further alternative embodiments, data communications with and between individual display panels may be provided via one of a number of wireless communication protocols, to lessen the requirements for physical pin contacts. In one such configuration, WiFi (or other wireless payload) may be incorporated into the LED PCB or panel controller or close-proximity contactless near-field data connections. Likewise power could be inductive, and/or moved to the corner mounts 230 via electrical contacts 232 in order to reduce the total number of mounts needed.

Figure 16:
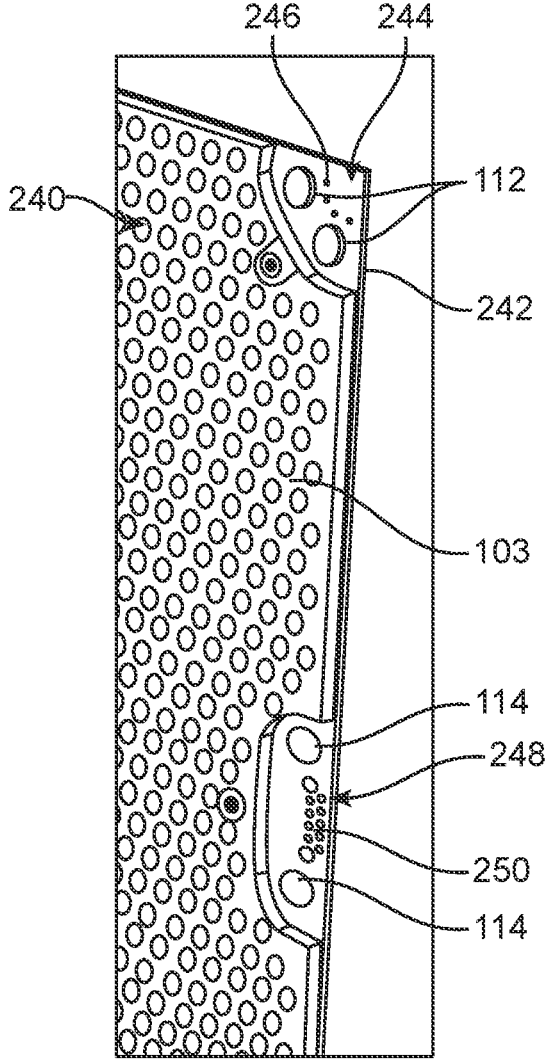
FIG. 16 is a detail back-perspective view of a portion of a video display wall illustrating an alternative mount system embodiment.

FIG. 16 illustrates an alternative display panel 240 utilizing alternative PCB 242 with corner contact zones 244 to accommodate alternative corner mount 230 and side contact zones 248 to accommodate alternative side mount 206. In this embodiment, corner contact zone 244 is provided with electrical contacts 246 configured to mate with electrical contacts 232 of corner mount 230. Corner contact zones 244 may be otherwise configured, for example, as described for structural contact zones 110 shown in FIG. 6. Side contact zones 248 include electrical contacts 250 configured to mate with electrical contacts 214 and two connector disks 114 configured to mate with magnets 120 of alternative side mounts 206.

Figure 17:
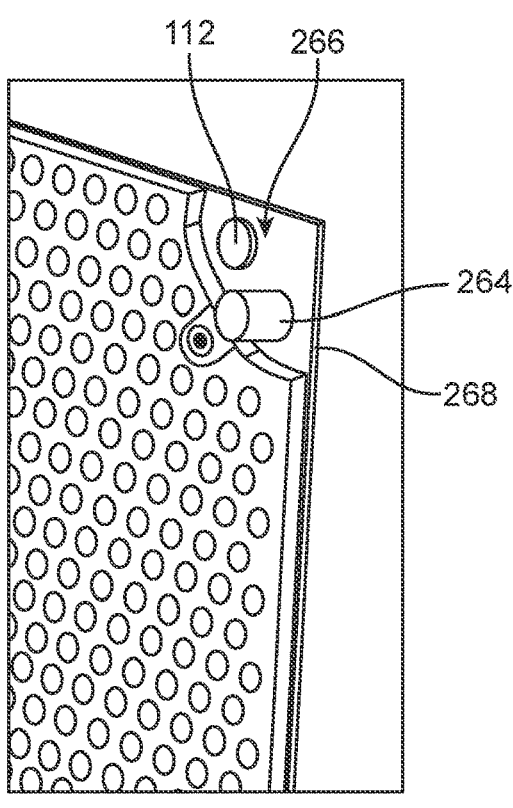
FIG. 17 is a detail back-perspective view of a portion of a video display wall illustrating another alternative mounting system embodiment.
Figure 18:
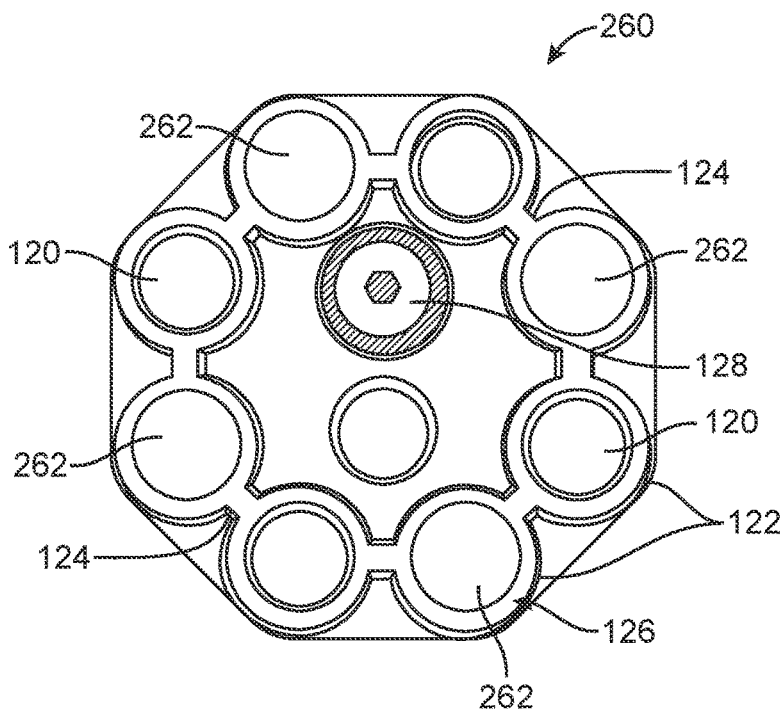
FIG. 18 is a plan view of a further alternative corner mount configured for use with the alternative mounting system shown in FIG. 17.

A further alternative corner mount embodiment is shown in FIGS. 17 and 18. In this embodiment, corner mount 260 is configured substantially as previously described for corner mount 104, except that every other annular wall 122 defines an alignment pin opening 262 configured to receive an alignment pin 264 mounted in contact zone 266 on the back of alternative PCB 268. Pin 264 is shown as cylindrical, however persons of ordinary skill in the art will appreciate that other shapes may be utilized. Also, pin openings 262 and pins 264 may be designed with a specific fit type, such as loose fit to transitional fit in order to provide a predictable and repeatable tolerance and fit with the appropriate ease of assembly and precision for a particular application.

Figure 19:
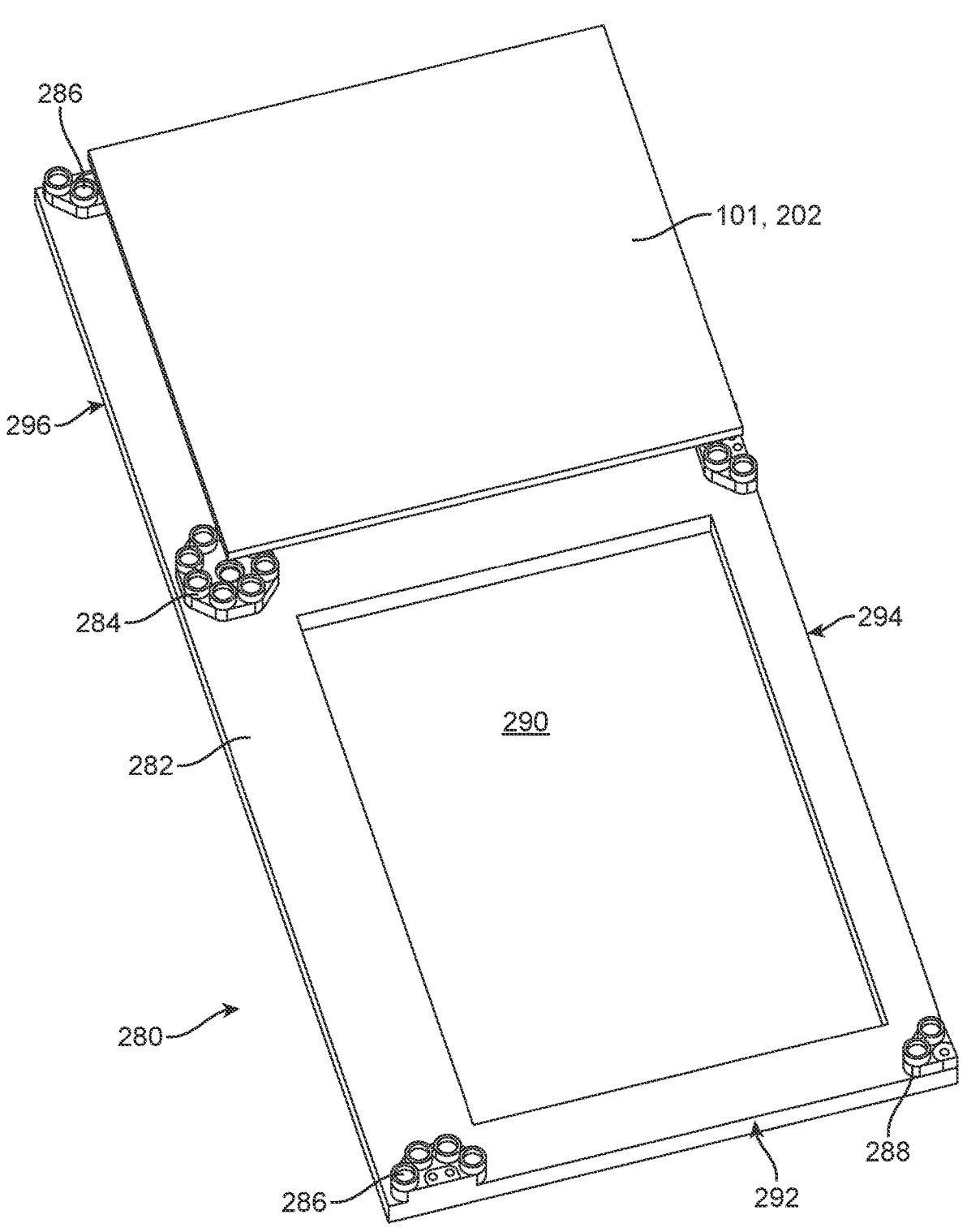
FIG. 19 is a partial perspective view of a display wall utilizing a further alternative embodiment of a mounting system according to the present disclosure.

FIG. 19 illustrates a further alternative modular support structure with integrated structural mounts. In one embodiment, support frame module 280 comprises frame member 282 with integral structural mounts 284, 286 and 288. For example, integral full corner mount 284 is configured substantially the same as corner mount 104 except that it is integrally formed with frame member 282. Likewise, integral half mount 286 is configured substantially the same as half-corner mount 204 and integral quarter mount 288 substantially the same as quarter-corner mount 205. Display panels, such as panels 101/202 may then be mounted to the structural mounts as previously described. To reduce weight, open spaces 290 may be provided within frame member 282. Any appropriate configuration of similar support frame modules may be provided to support a complete display wall. For example, modules 280 as shown may be butted together along narrow edge 292 or long edge 294 wherein complimentary shaped integral half or quarter mounts will mate to complete the structural support for an individual display panel. However, along edge 296, where there are available portions of the integral structural mounts, the next module 280 may be spaced apart by a display panel width. Based on the teachings of the present disclosure, persons of ordinary skill in the art may derive a wide variety of configurations for modular support frames. As will be appreciated by persons of ordinary skill based on the teachings contained herein, each contact surface feature serves a specific and independent purpose for the X, Y, Z alignment. By the nature of how these surface features interact and the fact that the structural mounts 104 mate with four panels, the X, Y panel-to-panel alignment is dictated by the panels themselves (via the connector disks 112) and the Z panel-to-panel alignment is dictated by the single plane of the structural contact surface and the rear face of the PCBs (which means the only Z axis tolerance to control is the PCB thickness itself). The annular walls 122 have sufficient height such that the display contact surface 126 is disposed above the surface of magnets 120 so that the magnets and connector disks play no part in the tolerance of dimension (D).

Figures 20, 21:
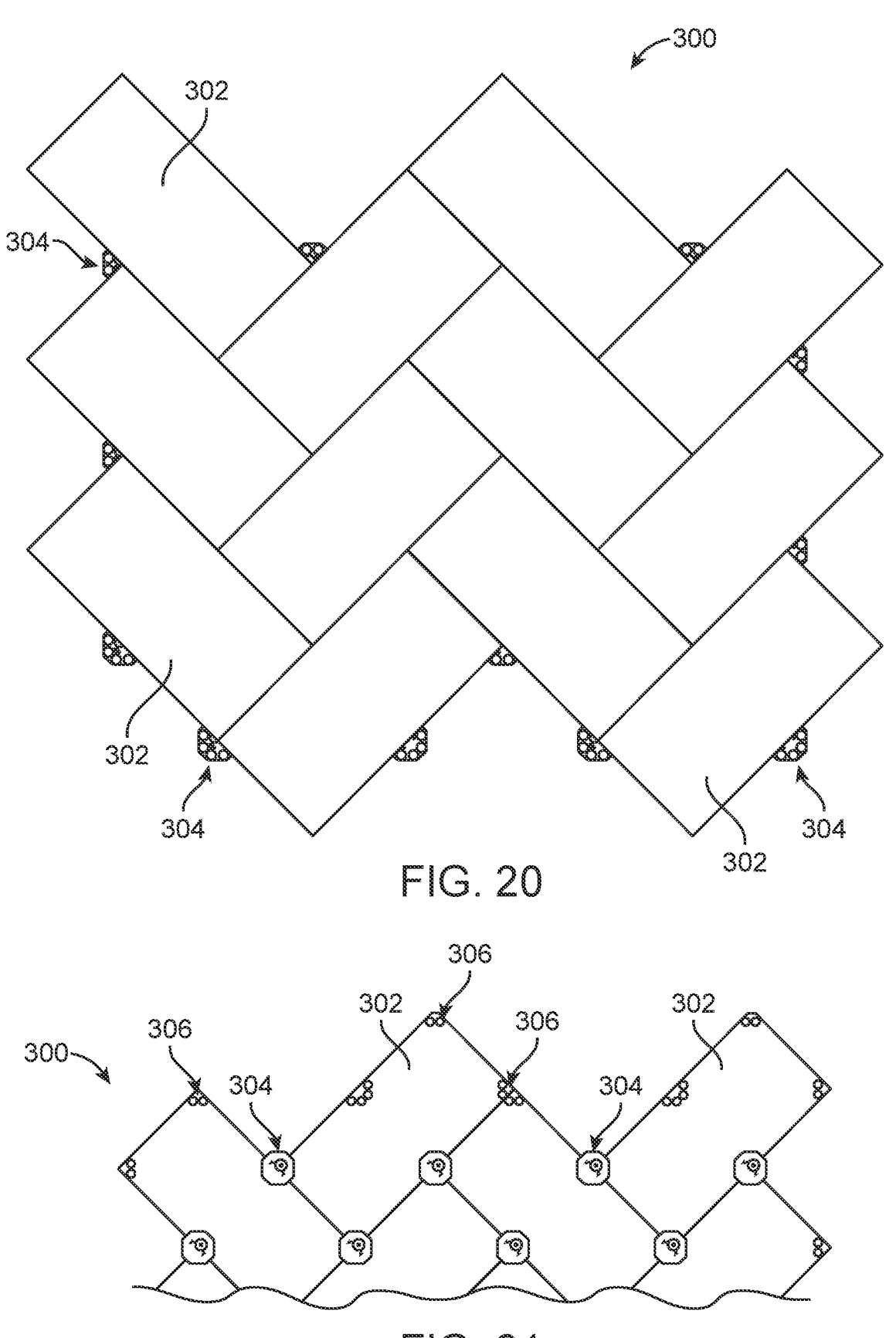
FIG. 20 is a partial front view of a further alternative embodiment of a video display wall with display panels arranged in a herringbone pattern.
FIG. 21 is detailed back view of a portion of the alternative video display wall shown in FIG. 20.

FIGS. 20 and 21 illustrate a further alternative embodiment of a video display wall 300 with rectangular video display panels 302 arranged in a herringbone pattern. Panels 302 may be constructed as otherwise described herein and joined by appropriate selection and combination of mounts 304 (which may comprise any of mounts 104, 106, 204, 205, 206, 260, 284, 286, 288, etc.) mating with connectors 306 (which may comprise, connectors or pins 112, 113, 120, 138, 264, etc,). Electrical contacts (not shown) also may be provided as described herein.

Figure 22:
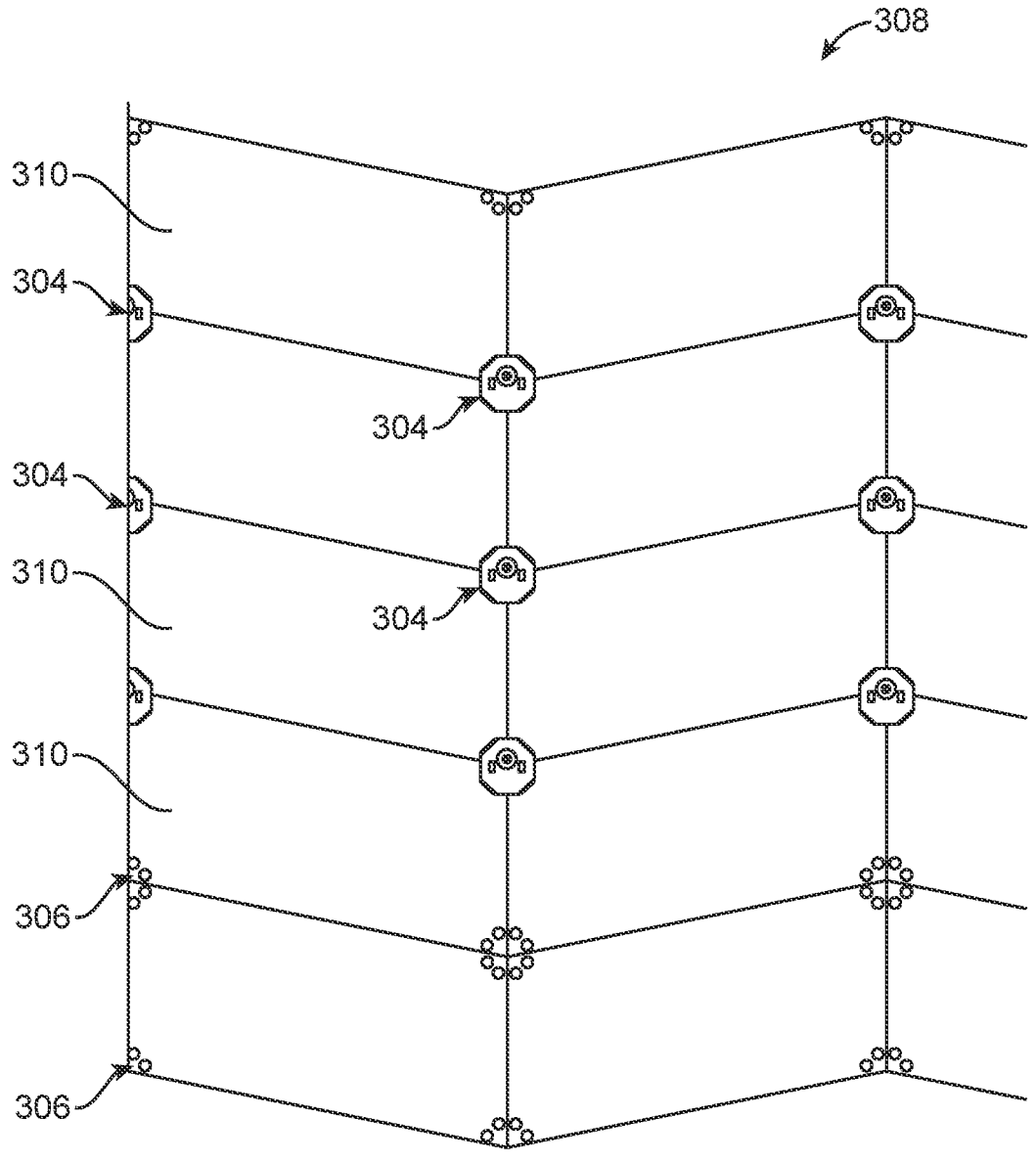
FIG. 22 is a partial back view of another alternative embodiment of a video display wall with display panels arranged in a chevron pattern.
Figure 23:
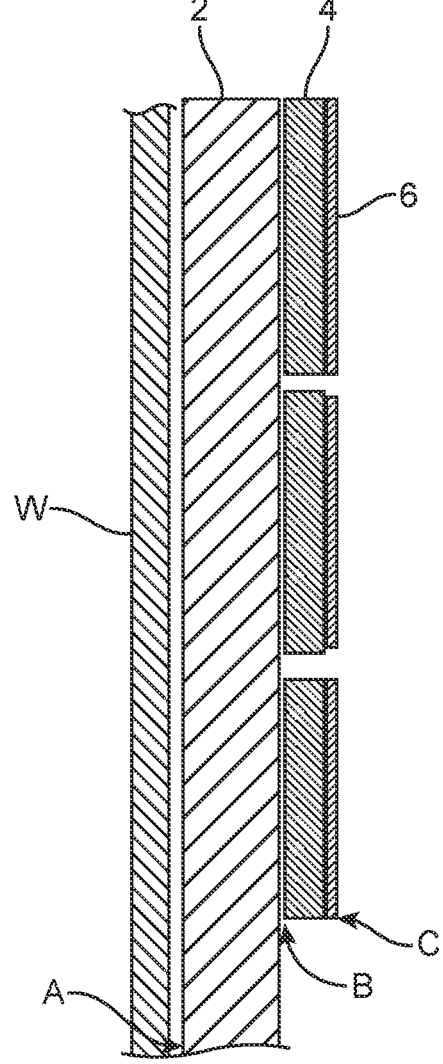
FIG. 23 is a side cross-section of a prior art video display wall mounting system.

FIG. 22 illustrates another alternative embodiment of a video display 308 with trapezoidal video display panels 310 arranged in a chevron patter. Panels 310 also may be constructed as otherwise described herein using mounts 304 and connectors 306 as also described.

As will be appreciated, embodiments disclosed herein provide a tolerance stack-up reduction related to LED displays and their enclosures/mechanics. Disclosed embodiments also provide a connection/mounting/leveling system compared to prior display wall connection systems and are compatible with a wide variety of display wall and display panel shapes and configurations as illustrated in the examples of FIGS. 1, 10, 19, 20 and 22. Utilizing the teachings of the present disclosure, persons of ordinary skill may derive other shapes, configurations and combinations of display panels and mounts to create many different video display wall structures, shapes and configurations.

The foregoing has been a detailed description of illustrative embodiments of the disclosure. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this disclosure. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present disclosure. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this disclosure or of the inventions as set forth in following claims.

What is claimed is:

1. A video display panel alignment mount, comprising:
a body member having opposed support and display sides;
a support contact surface on the support side lying in a first X-Y plane;
a display contact surface on the display side lying in a second X-Y plane at least substantially parallel to the first X-Y plane, the support contact surface and the display contact surface being separated by a fixed depth dimension along a Z direction at least substantially perpendicular to said X-Y planes;
at least one support connector on the support side configured to attach the body member to a support structure with the support contact surface against the support structure; and
at least two display connectors on the display side configured to attach a video display panel to the display contact surface.

2. The video display panel alignment mount of claim 1, wherein:
said support connector and said display connectors comprise connectors configured to fix the video display panel and support structure against the respective contact surfaces in the Z direction while allowing variations of position in their respective X-Y planes.

3. The video display panel alignment mount claim 1, wherein said support and display connectors comprise one or more of magnets, threaded connectors, pins, clips, sockets, bayonet mounts, or roller bearing sleeves.

4. The video display panel alignment mount of claim 1, wherein:
the body member comprises a front wall on the display side and a rear wall on the support side;

the display contact surface is disposed at least in part on a surface of the front wall;

the support contact surface is disposed at least in part on a surface of the rear wall;

the display connectors are disposed on the body member within the front wall; and the support connectors are disposed on the body member within the rear wall.

5. The video display panel alignment mount of claim 4, wherein:

the front wall is formed as a series of raised shapes with open centers;

the display contact surface surrounds said open centers; and display connectors are disposed in said open centers.

6. The video display panel alignment mount of claim 5, wherein:

said front wall is formed as a series of annular walls joined by connecting walls arranged around a periphery of the body member on the body member display side; and said display connectors comprise magnets disposed within at least one annular wall in each quadrant.

7. The video display panel alignment mount of claim 6, wherein said display connectors further comprise open annular walls configured to receive an alignment pin mounted on back corners of the video display panels, each quadrant contains one said open annular wall and one annular wall with the magnet.

8. The video display panel alignment mount of claim 1, wherein the display contact surface comprises four quadrants each configured to receive a corner of a video display panel, each said quadrant including at least one said display connector.

9. The video display panel alignment mount of claim 8, further comprising at least two display connectors in each said quadrant of the display contact surface.

10. The video display panel alignment mount of claim 8, further comprising a plurality of electrical contacts disposed in each said quadrant configured to mate with display panel electrical contacts to provide at least one of data or power connections between adjacent display panels.

11. The video display panel alignment mount of claim 1, wherein:

the display contact surface comprises two halves each configured to receive a corner of a video display panel; and each said display contact surface half includes at least one display connector.

12. The video display panel alignment mount of claim 11, wherein:

the body member has a straight outer edge extending across both halves of the display contact surface; and said straight outer edge is configured to align with outer edges of two adjacent video display panels when attached together to the display contact surface.

13. The video display panel alignment mount of claim 1, wherein:

the display contact surface comprises two halves each configured to receive a side portion of a video display panel;

each said display contact surface half includes at least one display connector; and a plurality of electrical contacts disposed in each said half configured to mate with display panel electrical contacts to provide at least one of data or power connections between adjacent display panels.

14. The video display panel alignment mount of claim 13, further comprising a power supply connector in electrical communication with selected electrical contacts of said plurality of electrical contacts.

15. The video display panel alignment mount of claim 13, wherein:

the body member has a rectangular shape with opposed short sides and opposed longer sides;

the display contact surface in each half comprises two annular walls spaced apart along each longer side; and the display connectors are disposed within the annular walls.

16. The video display panel alignment mount of claim 1, wherein plural said alignment mounts are integrated with a support frame on the support side.

17. A video display wall, comprising a plurality of the video display panel alignment mounts of claim 1, and a plurality of said video display panels mounted with said plurality of said panel alignment mounts on the support structure, wherein said plurality of panel alignment mounts each have the same fixed depth dimension with uniform tolerance on the fixed depth dimension.

18. A method of mounting and aligning video display panels in a video display wall, comprising:

providing and leveling a video display panel support structure;

directly attaching an array of alignment mounts to the support structure, each alignment mount having the same thickness dimension with uniform tolerance on the thickness dimension; and directly attaching the video display panels at each corner to the alignment mounts, wherein said alignment mounts form a single layer of said thickness dimension between the video display panels and support structure.

19. The method of claim 18, wherein the video display panels each comprise an array of light-emitting elements supported on a printed circuit board (PCB) and said directly attaching the video display panels comprises directly attaching the alignment mounts to said PCBs.

20. The method of claim 18, wherein the PCBs are magnetically connected to the alignment mounts.

21. The method of claim 18, further comprising removing one or more individual video display panels from the video wall in a direction perpendicular to the video wall display surface without moving video display panels adjacent to the removed video display panel.

22. The method of claim 18, wherein said uniform tolerance in the thickness direction is in the range of about +/−0.01 mm or less.

23. The video display wall of claim 17, wherein said uniform tolerance in the fixed depth dimension is in the range of about +/−0.01 mm or less.

* * * * *